(12) United States Patent
Horn et al.

(10) Patent No.: US 12,191,898 B2
(45) Date of Patent: Jan. 7, 2025

(54) LOCAL OSCILLATOR LEAKAGE REPORTING

(71) Applicant: QUALCOMM Incorporated, San Diego, CA (US)

(72) Inventors: Idan Michael Horn, Hod Hasharon (IL); Shay Landis, Hod Hasharon (IL); Assaf Touboul, Netanya (IL)

(73) Assignee: QUALCOMM Incorporated, San Diego, CA (US)

( * ) Notice: Subject to any disclaimer, the term of this patent is extended or adjusted under 35 U.S.C. 154(b) by 367 days.

(21) Appl. No.: 17/664,573

(22) Filed: May 23, 2022

(65) Prior Publication Data
US 2023/0378982 A1 Nov. 23, 2023

(51) Int. Cl.
*H04B 1/04* (2006.01)
*H03D 3/00* (2006.01)
*H04B 17/10* (2015.01)

(52) U.S. Cl.
CPC .......... *H04B 1/0475* (2013.01); *H03D 3/009* (2013.01); *H04B 17/101* (2015.01); *H04B 2215/064* (2013.01)

(58) Field of Classification Search
CPC ........ H04B 1/0475; H04B 1/525; H04B 1/04; H04B 1/40; H03D 3/009; H03D 3/241
See application file for complete search history.

(56) References Cited

U.S. PATENT DOCUMENTS

| | | | |
|---|---|---|---|
| 9,787,415 B2* | 10/2017 | Fan | H04B 1/525 |
| 2014/0269864 A1* | 9/2014 | Aparin | H04B 1/40 |
| | | | 375/221 |
| 2018/0254786 A1* | 9/2018 | McLaurin | H03D 7/165 |

* cited by examiner

*Primary Examiner* — Tuan Pham
(74) *Attorney, Agent, or Firm* — Harrity & Harrity LLP / Qualcomm

(57) ABSTRACT

Various aspects of the present disclosure generally relate to wireless communication. In some aspects, a network entity may transmit a signal generated using a mixer, wherein the signal is subject to local oscillator (LO) leakage in connection with the generation using the mixer. The network entity may transmit an LO leakage estimate indicator based at least in part on the LO leakage of the signal in connection with the generation using the mixer. Numerous other aspects are described.

15 Claims, 9 Drawing Sheets

LOCAL OSCILLATOR LEAKAGE REPORTING

FIELD OF THE DISCLOSURE

Aspects of the present disclosure generally relate to wireless communication and to techniques and apparatuses for local oscillator leakage reporting.

DESCRIPTION OF RELATED ART

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., bandwidth, transmit power, or the like). Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, time division synchronous code division multiple access (TD-SCDMA) systems, and Long Term Evolution (LTE). LTE/LTE-Advanced is a set of enhancements to the Universal Mobile Telecommunications System (UMTS) mobile standard promulgated by the Third Generation Partnership Project (3GPP).

A wireless network may include one or more base stations that support communication for a user equipment (UE) or multiple UEs. A UE may communicate with a base station via downlink communications and uplink communications. "Downlink" (or "DL") refers to a communication link from the base station to the UE, and "uplink" (or "UL") refers to a communication link from the UE to the base station.

The above multiple access technologies have been adopted in various telecommunication standards to provide a common protocol that enables different UEs to communicate on a municipal, national, regional, and/or global level. New Radio (NR), which may be referred to as 5G, is a set of enhancements to the LTE mobile standard promulgated by the 3GPP. NR is designed to better support mobile broadband internet access by improving spectral efficiency, lowering costs, improving services, making use of new spectrum, and better integrating with other open standards using orthogonal frequency division multiplexing (OFDM) with a cyclic prefix (CP) (CP-OFDM) on the downlink, using CP-OFDM and/or single-carrier frequency division multiplexing (SC-FDM) (also known as discrete Fourier transform spread OFDM (DFT-s-OFDM)) on the uplink, as well as supporting beamforming, multiple-input multiple-output (MIMO) antenna technology, and carrier aggregation. As the demand for mobile broadband access continues to increase, further improvements in LTE, NR, and other radio access technologies remain useful.

SUMMARY

Some aspects described herein relate to a method of wireless communication performed by a network entity. The method may include transmitting a signal generated using a mixer, wherein the signal is subject to local oscillator (LO) leakage in connection with the generation using the mixer. The method may include transmitting an LO leakage estimate indicator based at least in part on the LO leakage of the signal in connection with the generation using the mixer.

Some aspects described herein relate to a method of wireless communication performed by a network entity. The method may include receiving a signal generated using a mixer, wherein the signal is subject to LO leakage in connection with the generation using the mixer. The method may include receiving an LO leakage estimate indicator based at least in part on the LO leakage of the signal in connection with the generation using the mixer.

Some aspects described herein relate to a network entity for wireless communication. The network entity may include a memory and one or more processors coupled to the memory. The one or more processors may be configured to transmit a signal generated using a mixer, wherein the signal is subject to LO leakage in connection with the generation using the mixer. The one or more processors may be configured to transmit an LO leakage estimate indicator based at least in part on the LO leakage of the signal in connection with the generation using the mixer.

Some aspects described herein relate to a network entity for wireless communication. The network entity may include a memory and one or more processors coupled to the memory. The one or more processors may be configured to receive a signal generated using a mixer, wherein the signal is subject to LO leakage in connection with the generation using the mixer. The one or more processors may be configured to receive an LO leakage estimate indicator based at least in part on the LO leakage of the signal in connection with the generation using the mixer.

Some aspects described herein relate to a non-transitory computer-readable medium that stores a set of instructions for wireless communication by a network entity. The set of instructions, when executed by one or more processors of the network entity, may cause the network entity to transmit a signal generated using a mixer, wherein the signal is subject to LO leakage in connection with the generation using the mixer. The set of instructions, when executed by one or more processors of the network entity, may cause the network entity to transmit an LO leakage estimate indicator based at least in part on the LO leakage of the signal in connection with the generation using the mixer.

Some aspects described herein relate to a non-transitory computer-readable medium that stores a set of instructions for wireless communication by a network entity. The set of instructions, when executed by one or more processors of the network entity, may cause the network entity to receive a signal generated using a mixer, wherein the signal is subject to LO leakage in connection with the generation using the mixer. The set of instructions, when executed by one or more processors of the network entity, may cause the network entity to receive an LO leakage estimate indicator based at least in part on the LO leakage of the signal in connection with the generation using the mixer.

Some aspects described herein relate to an apparatus for wireless communication. The apparatus may include means for transmitting a signal generated using a mixer, wherein the signal is subject to LO leakage in connection with the generation using the mixer. The apparatus may include means for transmitting an LO leakage estimate indicator based at least in part on the LO leakage of the signal in connection with the generation using the mixer.

Some aspects described herein relate to an apparatus for wireless communication. The apparatus may include means for receiving a signal generated using a mixer, wherein the signal is subject to LO leakage in connection with the generation using the mixer. The apparatus may include means for receiving an LO leakage estimate indicator based at least in part on the LO leakage of the signal in connection with the generation using the mixer.

Aspects generally include a method, apparatus, system, computer program product, non-transitory computer-readable medium, user equipment, base station, wireless communication device, and/or processing system as substantially described herein with reference to and as illustrated by the drawings and specification.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims Characteristics of the concepts disclosed herein, both their organization and method of operation, together with associated advantages will be better understood from the following description when considered in connection with the accompanying figures. Each of the figures is provided for the purposes of illustration and description, and not as a definition of the limits of the claims.

BRIEF DESCRIPTION OF THE DRAWINGS

So that the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects. The same reference numbers in different drawings may identify the same or similar elements.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. One skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

Several aspects of telecommunication systems will now be presented with reference to various apparatuses and techniques. These apparatuses and techniques will be described in the following detailed description and illustrated in the accompanying drawings by various blocks, modules, components, circuits, steps, processes, algorithms, or the like (collectively referred to as "elements"). These elements may be implemented using hardware, software, or combinations thereof. Whether such elements are implemented as hardware or software depends upon the particular application and design constraints imposed on the overall system.

While aspects may be described herein using terminology commonly associated with a 5G or New Radio (NR) radio access technology (RAT), aspects of the present disclosure can be applied to other RATs, such as a 3G RAT, a 4G RAT, and/or a RAT subsequent to 5G (e.g., 6G).

Figure 1:
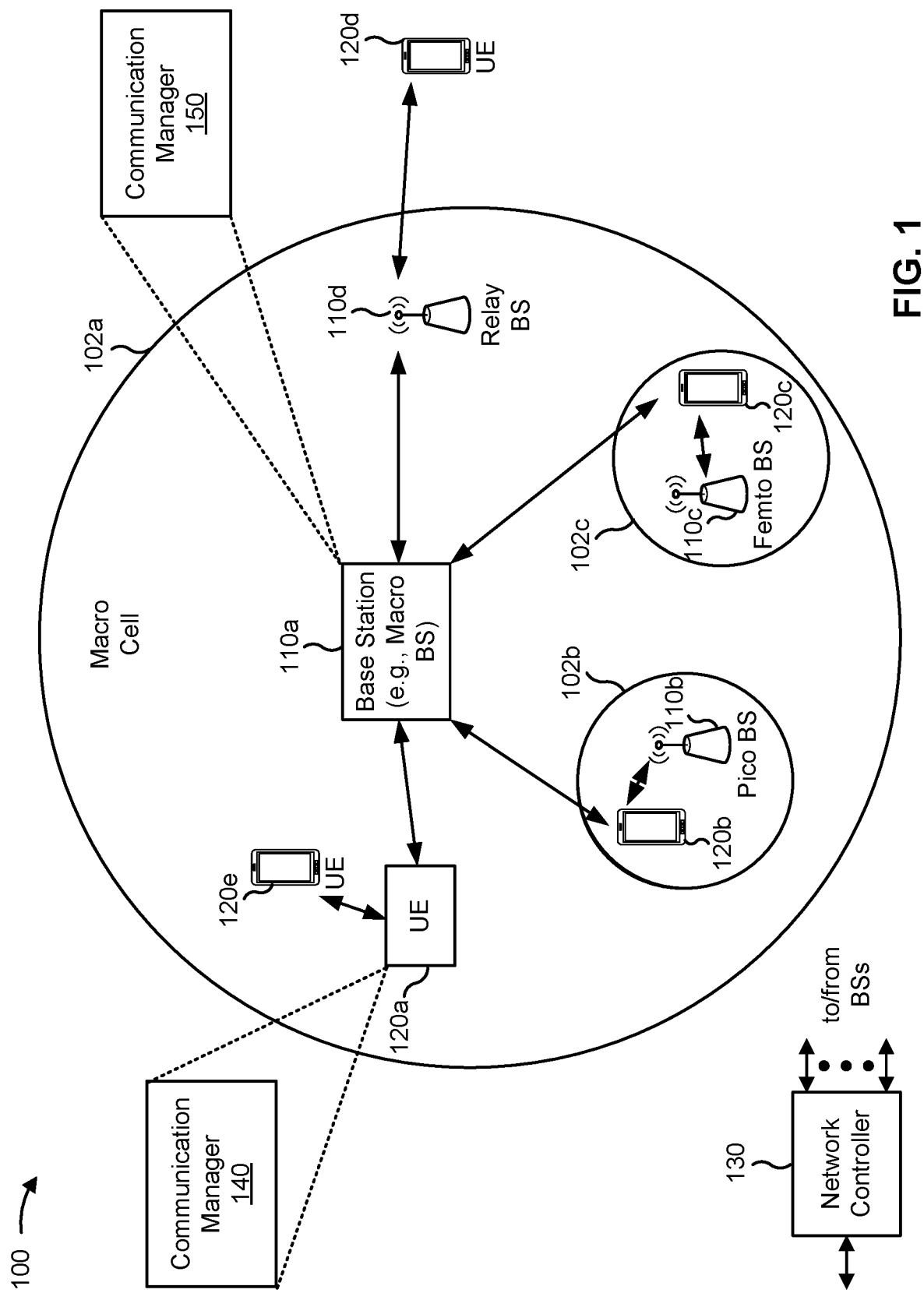
FIG. 1 is a diagram illustrating an example of a wireless network, in accordance with the present disclosure.

FIG. 1 is a diagram illustrating an example of a wireless network 100, in accordance with the present disclosure. The wireless network 100 may be or may include elements of a 5G (e.g., NR) network and/or a 4G (e.g., Long Term Evolution (LTE)) network, among other examples. The wireless network 100 may include one or more base stations 110 (shown as a BS 110*a*, a BS 110*b*, a BS 110*c*, and a BS 110*d*), a user equipment (UE) 120 or multiple UEs 120 (shown as a UE 120*a*, a UE 120*b*, a UE 120*c*, a UE 120*d*, and a UE 120*e*), and/or other network entities. A base station 110 is an entity that communicates with UEs 120. A base station 110 (sometimes referred to as a BS) may include, for example, an NR base station, an LTE base station, a Node B, an eNB (e.g., in 4G), a gNB (e.g., in 5G), an access point, and/or a transmission reception point (TRP). Each base station 110 may provide communication coverage for a particular geographic area. In the Third Generation Partnership Project (3GPP), the term "cell" can refer to a coverage area of a base station 110 and/or a base station subsystem serving this coverage area, depending on the context in which the term is used.

A base station 110 may provide communication coverage for a macro cell, a pico cell, a femto cell, and/or another type of cell. A macro cell may cover a relatively large geographic area (e.g., several kilometers in radius) and may allow unrestricted access by UEs 120 with service subscriptions. A pico cell may cover a relatively small geographic area and may allow unrestricted access by UEs 120 with service subscription. A femto cell may cover a relatively small geographic area (e.g., a home) and may allow restricted access by UEs 120 having association with the femto cell (e.g., UEs 120 in a closed subscriber group (CSG)). A base station 110 for a macro cell may be referred to as a macro base station. A base station 110 for a pico cell may be referred to as a pico base station. A base station 110 for a femto cell may be referred to as a femto base station or an in-home base station. In the example shown in FIG. 1, the BS 110a may be a macro base station for a macro cell 102a, the BS 110b may be a pico base station for a pico cell 102b, and the BS 110c may be a femto base station for a femto cell 102c. A base station may support one or multiple (e.g., three) cells.

In some examples, a cell may not necessarily be stationary, and the geographic area of the cell may move according to the location of a base station 110 that is mobile (e.g., a mobile base station). In some examples, the base stations 110 may be interconnected to one another and/or to one or more other base stations 110 or network nodes (not shown) in the wireless network 100 through various types of backhaul interfaces, such as a direct physical connection or a virtual network, using any suitable transport network.

The wireless network 100 may include one or more relay stations. A relay station is an entity that can receive a transmission of data from an upstream station (e.g., a base station 110 or a UE 120) and send a transmission of the data to a downstream station (e.g., a UE 120 or a base station 110). A relay station may be a UE 120 that can relay transmissions for other UEs 120. In the example shown in FIG. 1, the BS 110d (e.g., a relay base station) may communicate with the BS 110a (e.g., a macro base station) and the UE 120d in order to facilitate communication between the BS 110a and the UE 120d. A base station 110 that relays communications may be referred to as a relay station, a relay base station, a relay, or the like.

The wireless network 100 may be a heterogeneous network that includes base stations 110 of different types, such as macro base stations, pico base stations, femto base stations, relay base stations, or the like. These different types of base stations 110 may have different transmit power levels, different coverage areas, and/or different impacts on interference in the wireless network 100. For example, macro base stations may have a high transmit power level (e.g., 5 to 40 watts) whereas pico base stations, femto base stations, and relay base stations may have lower transmit power levels (e.g., 0.1 to 2 watts).

A network controller 130 may couple to or communicate with a set of base stations 110 and may provide coordination and control for these base stations 110. The network controller 130 may communicate with the base stations 110 via a backhaul communication link. The base stations 110 may communicate with one another directly or indirectly via a wireless or wireline backhaul communication link.

The UEs 120 may be dispersed throughout the wireless network 100, and each UE 120 may be stationary or mobile. A UE 120 may include, for example, an access terminal, a terminal, a mobile station, and/or a subscriber unit. A UE 120 may be a cellular phone (e.g., a smart phone), a personal digital assistant (PDA), a wireless modem, a wireless communication device, a handheld device, a laptop computer, a cordless phone, a wireless local loop (WLL) station, a tablet, a camera, a gaming device, a netbook, a smartbook, an ultrabook, a medical device, a biometric device, a wearable device (e.g., a smart watch, smart clothing, smart glasses, a smart wristband, smart jewelry (e.g., a smart ring or a smart bracelet)), an entertainment device (e.g., a music device, a video device, and/or a satellite radio), a vehicular component or sensor, a smart meter/sensor, industrial manufacturing equipment, a global positioning system device, and/or any other suitable device that is configured to communicate via a wireless or wired medium.

Some UEs 120 may be considered machine-type communication (MTC) or evolved or enhanced machine-type communication (eMTC) UEs. An MTC UE and/or an eMTC UE may include, for example, a robot, a drone, a remote device, a sensor, a meter, a monitor, and/or a location tag, that may communicate with a base station, another device (e.g., a remote device), or some other entity. Some UEs 120 may be considered Internet-of-Things (IoT) devices, and/or may be implemented as NB-IoT (narrowband IoT) devices. Some UEs 120 may be considered a Customer Premises Equipment. A UE 120 may be included inside a housing that houses components of the UE 120, such as processor components and/or memory components. In some examples, the processor components and the memory components may be coupled together. For example, the processor components (e.g., one or more processors) and the memory components (e.g., a memory) may be operatively coupled, communicatively coupled, electronically coupled, and/or electrically coupled.

In general, any number of wireless networks 100 may be deployed in a given geographic area. Each wireless network 100 may support a particular RAT and may operate on one or more frequencies. A RAT may be referred to as a radio technology, an air interface, or the like. A frequency may be referred to as a carrier, a frequency channel, or the like. Each frequency may support a single RAT in a given geographic area in order to avoid interference between wireless networks of different RATs. In some cases, NR or 5G RAT networks may be deployed.

In some examples, two or more UEs 120 (e.g., shown as UE 120a and UE 120e) may communicate directly using one or more sidelink channels (e.g., without using a base station 110 as an intermediary to communicate with one another). For example, the UEs 120 may communicate using peer-to-peer (P2P) communications, device-to-device (D2D) communications, a vehicle-to-everything (V2X) protocol (e.g., which may include a vehicle-to-vehicle (V2V) protocol, a vehicle-to-infrastructure (V2I) protocol, or a vehicle-to-pedestrian (V2P) protocol), and/or a mesh network. In such examples, a UE 120 may perform scheduling operations, resource selection operations, and/or other operations described elsewhere herein as being performed by the base station 110.

Devices of the wireless network 100 may communicate using the electromagnetic spectrum, which may be subdivided by frequency or wavelength into various classes, bands, channels, or the like. For example, devices of the wireless network 100 may communicate using one or more operating bands. In 5G NR, two initial operating bands have been identified as frequency range designations FR1 (410 MHz-7.125 GHz) and FR2 (24.25 GHz-52.6 GHz). It should be understood that although a portion of FR1 is greater than 6 GHz, FR1 is often referred to (interchangeably) as a "Sub-6 GHz" band in various documents and articles. A similar nomenclature issue sometimes occurs with regard to FR2, which is often referred to (interchangeably) as a "millimeter wave" band in documents and articles, despite being different from the extremely high frequency (EHF) band (30 GHz-300 GHz) which is identified by the International Telecommunications Union (ITU) as a "millimeter wave" band.

The frequencies between FR1 and FR2 are often referred to as mid-band frequencies. Recent 5G NR studies have identified an operating band for these mid-band frequencies as frequency range designation FR3 (7.125 GHz-24.25 GHz). Frequency bands falling within FR3 may inherit FR1 characteristics and/or FR2 characteristics, and thus may effectively extend features of FR1 and/or FR2 into mid-band frequencies. In addition, higher frequency bands are currently being explored to extend 5G NR operation beyond 52.6 GHz. For example, three higher operating bands have been identified as frequency range designations FR4a or FR4-1 (52.6 GHz-71 GHz), FR4 (52.6 GHz-114.25 GHz), and FR5 (114.25 GHz-300 GHz). Each of these higher frequency bands falls within the EHF band.

With the above examples in mind, unless specifically stated otherwise, it should be understood that the term "sub-6 GHz" or the like, if used herein, may broadly represent frequencies that may be less than 6 GHz, may be within FR1, or may include mid-band frequencies. Further, unless specifically stated otherwise, it should be understood that the term "millimeter wave" or the like, if used herein, may broadly represent frequencies that may include mid-band frequencies, may be within FR2, FR4, FR4-a or FR4-1, and/or FR5, or may be within the EHF band. It is contemplated that the frequencies included in these operating bands (e.g., FR1, FR2, FR3, FR4, FR4-a, FR4-1, and/or FR5) may be modified, and techniques described herein are applicable to those modified frequency ranges.

In some aspects, a network entity (e.g., the UE 120 or the base station 110) may include a communication manager 140 or 150. As described in more detail elsewhere herein, the communication manager 140 or 150 may transmit a signal generated using a mixer, wherein the signal is subject to local oscillator (LO) leakage in connection with the generation using the mixer; and transmit an LO leakage estimate indicator based at least in part on the LO leakage of the signal in connection with the generation using the mixer. Additionally, or alternatively, the communication manager 140 or 150 may receive a signal generated using a mixer, wherein the signal is subject to LO leakage in connection with the generation using the mixer; and receive an LO leakage estimate indicator based at least in part on the LO leakage of the signal in connection with the generation using the mixer. Additionally, or alternatively, the communication manager 140 or 150 may perform one or more other operations described herein.

As indicated above, FIG. 1 is provided as an example. Other examples may differ from what is described with regard to FIG. 1.

Figure 2:
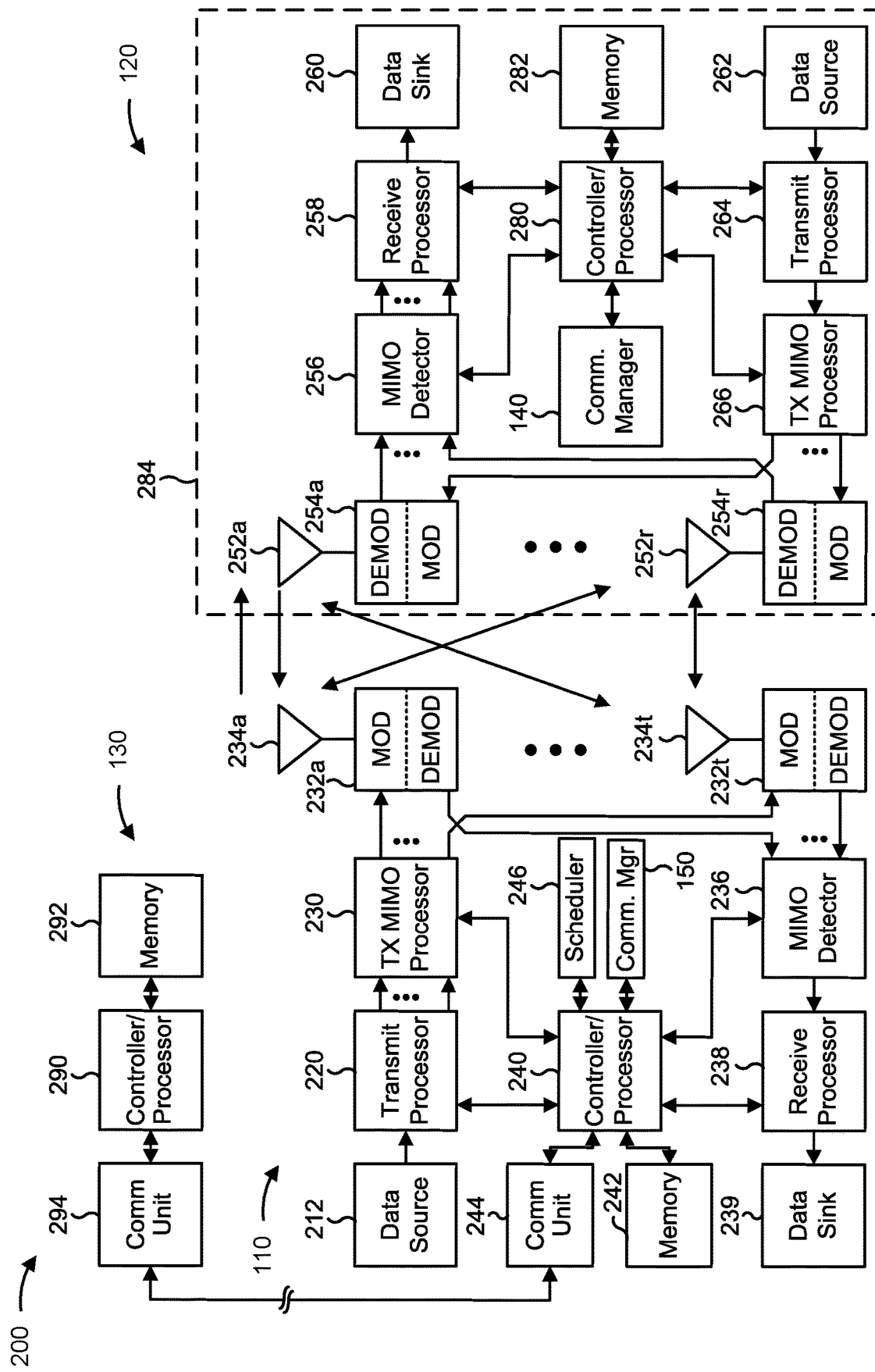
FIG. 2 is a diagram illustrating an example of a base station in communication with a user equipment (UE) in a wireless network, in accordance with the present disclosure.

FIG. 2 is a diagram illustrating an example 200 of a base station 110 in communication with a UE 120 in a wireless network 100, in accordance with the present disclosure. The base station 110 may be equipped with a set of antennas 234a through 234t, such as T antennas (T≥1). The UE 120 may be equipped with a set of antennas 252a through 252r, such as R antennas (R≥1).

At the base station 110, a transmit processor 220 may receive data, from a data source 212, intended for the UE 120 (or a set of UEs 120). The transmit processor 220 may select one or more modulation and coding schemes (MCSs) for the UE 120 based at least in part on one or more channel quality indicators (CQIs) received from that UE 120. The base station 110 may process (e.g., encode and modulate) the data for the UE 120 based at least in part on the MCS(s) selected for the UE 120 and may provide data symbols for the UE 120. The transmit processor 220 may process system information (e.g., for semi-static resource partitioning information (SRPI)) and control information (e.g., CQI requests, grants, and/or upper layer signaling) and provide overhead symbols and control symbols. The transmit processor 220 may generate reference symbols for reference signals (e.g., a cell-specific reference signal (CRS) or a demodulation reference signal (DMRS)) and synchronization signals (e.g., a primary synchronization signal (PSS) or a secondary synchronization signal (SSS)). A transmit (TX) multiple-input multiple-output (MIMO) processor 230 may perform spatial processing (e.g., precoding) on the data symbols, the control symbols, the overhead symbols, and/or the reference symbols, if applicable, and may provide a set of output symbol streams (e.g., T output symbol streams) to a corresponding set of modems 232 (e.g., T modems), shown as modems 232a through 232t. For example, each output symbol stream may be provided to a modulator component (shown as MOD) of a modem 232. Each modem 232 may use a respective modulator component to process a respective output symbol stream (e.g., for OFDM) to obtain an output sample stream. Each modem 232 may further use a respective modulator component to process (e.g., convert to analog, amplify, filter, and/or upconvert) the output sample stream to obtain a downlink signal. The modems 232a through 232t may transmit a set of downlink signals (e.g., T downlink signals) via a corresponding set of antennas 234 (e.g., T antennas), shown as antennas 234a through 234t.

At the UE 120, a set of antennas 252 (shown as antennas 252a through 252r) may receive the downlink signals from the base station 110 and/or other base stations 110 and may provide a set of received signals (e.g., R received signals) to a set of modems 254 (e.g., R modems), shown as modems 254a through 254r. For example, each received signal may be provided to a demodulator component (shown as DEMOD) of a modem 254. Each modem 254 may use a respective demodulator component to condition (e.g., filter, amplify, downconvert, and/or digitize) a received signal to obtain input samples. Each modem 254 may use a demodulator component to further process the input samples (e.g., for OFDM) to obtain received symbols. A MIMO detector 256 may obtain received symbols from the modems 254, may perform MIMO detection on the received symbols if applicable, and may provide detected symbols. A receive processor 258 may process (e.g., demodulate and decode) the detected symbols, may provide decoded data for the UE 120 to a data sink 260, and may provide decoded control information and system information to a controller/processor 280. The term "controller/processor" may refer to one or more controllers, one or more processors, or a combination thereof. A channel processor may determine a reference signal received power (RSRP) parameter, a received signal strength indicator (RSSI) parameter, a reference signal received quality (RSRQ) parameter, and/or a CQI parameter, among other examples. In some examples, one or more components of the UE 120 may be included in a housing 284.

The network controller 130 may include a communication unit 294, a controller/processor 290, and a memory 292. The network controller 130 may include, for example, one or more devices in a core network. The network controller 130 may communicate with the base station 110 via the communication unit 294.

One or more antennas (e.g., antennas 234a through 234t and/or antennas 252a through 252r) may include, or may be included within, one or more antenna panels, one or more antenna groups, one or more sets of antenna elements, and/or one or more antenna arrays, among other examples. An antenna panel, an antenna group, a set of antenna elements, and/or an antenna array may include one or more antenna elements (within a single housing or multiple housings), a set of coplanar antenna elements, a set of non-coplanar antenna elements, and/or one or more antenna elements coupled to one or more transmission and/or reception components, such as one or more components of FIG. 2.

On the uplink, at the UE 120, a transmit processor 264 may receive and process data from a data source 262 and control information (e.g., for reports that include RSRP, RSSI, RSRQ, and/or CQI) from the controller/processor 280. The transmit processor 264 may generate reference symbols for one or more reference signals. The symbols from the transmit processor 264 may be precoded by a TX MIMO processor 266 if applicable, further processed by the modems 254 (e.g., for DFT-s-OFDM or CP-OFDM), and transmitted to the base station 110. In some examples, the modem 254 of the UE 120 may include a modulator and a demodulator. In some examples, the UE 120 includes a transceiver. The transceiver may include any combination of the antenna(s) 252, the modem(s) 254, the MIMO detector 256, the receive processor 258, the transmit processor 264, and/or the TX MIMO processor 266. The transceiver may be used by a processor (e.g., the controller/processor 280) and the memory 282 to perform aspects of any of the methods described herein (e.g., with reference to FIGS. 6-9).

At the base station 110, the uplink signals from UE 120 and/or other UEs may be received by the antennas 234, processed by the modem 232 (e.g., a demodulator component, shown as DEMOD, of the modem 232), detected by a MIMO detector 236 if applicable, and further processed by a receive processor 238 to obtain decoded data and control information sent by the UE 120. The receive processor 238 may provide the decoded data to a data sink 239 and provide the decoded control information to the controller/processor 240. The base station 110 may include a communication unit 244 and may communicate with the network controller 130 via the communication unit 244. The base station 110 may include a scheduler 246 to schedule one or more UEs 120 for downlink and/or uplink communications. In some examples, the modem 232 of the base station 110 may include a modulator and a demodulator. In some examples, the base station 110 includes a transceiver. The transceiver may include any combination of the antenna(s) 234, the modem(s) 232, the MIMO detector 236, the receive processor 238, the transmit processor 220, and/or the TX MIMO processor 230. The transceiver may be used by a processor (e.g., the controller/processor 240) and the memory 242 to perform aspects of any of the methods described herein (e.g., with reference to FIGS. 6-9).

The controller/processor 240 of the base station 110, the controller/processor 280 of the UE 120, and/or any other component(s) of FIG. 2 may perform one or more techniques associated with LO leakage reporting, as described in more detail elsewhere herein. In some aspects, the network entity described herein is the base station 110, is included in the base station 110, or includes one or more components of the base station 110 shown in FIG. 2. In some aspects, the network entity described herein is the UE 120, is included in the UE 120, or includes one or more components of the UE 120 shown in FIG. 2. For example, the controller/processor 240 of the base station 110, the controller/processor 280 of the UE 120, and/or any other component(s) of FIG. 2 may perform or direct operations of, for example, process 700 of FIG. 7, process 800 of FIG. 8, and/or other processes as described herein. The memory 242 and the memory 282 may store data and program codes for the base station 110 and the UE 120, respectively. In some examples, the memory 242 and/or the memory 282 may include a non-transitory computer-readable medium storing one or more instructions (e.g., code and/or program code) for wireless communication. For example, the one or more instructions, when executed (e.g., directly, or after compiling, converting, and/or interpreting) by one or more processors of the base station 110 and/or the UE 120, may cause the one or more processors, the UE 120, and/or the base station 110 to perform or direct operations of, for example, process 700 of FIG. 7, process 800 of FIG. 8, and/or other processes as described herein. In some examples, executing instructions may include running the instructions, converting the instructions, compiling the instructions, and/or interpreting the instructions, among other examples.

In some aspects, a network entity (e.g., the UE 120 or the base station 110, among other examples) includes means for transmitting a signal generated using a mixer, wherein the signal is subject to LO leakage in connection with the generation using the mixer; and/or means for transmitting an LO leakage estimate indicator based at least in part on the LO leakage of the signal in connection with the generation using the mixer. In some aspects, the network entity includes means for receiving a signal generated using a mixer, wherein the signal is subject to LO leakage in connection with the generation using the mixer; and/or means for receiving an LO leakage estimate indicator based at least in part on the LO leakage of the signal in connection with the generation using the mixer. In some aspects, the means for the network entity to perform operations described herein may include, for example, one or more of communication manager 150, transmit processor 220, TX MIMO processor 230, modem 232, antenna 234, MIMO detector 236, receive processor 238, controller/processor 240, memory 242, or scheduler 246. In some aspects, the means for the network entity to perform operations described herein may include, for example, one or more of communication manager 140, antenna 252, modem 254, MIMO detector 256, receive processor 258, transmit processor 264, TX MIMO processor 266, controller/processor 280, or memory 282.

While blocks in FIG. 2 are illustrated as distinct components, the functions described above with respect to the blocks may be implemented in a single hardware, software, or combination component or in various combinations of components. For example, the functions described with respect to the transmit processor 264, the receive processor 258, and/or the TX MIMO processor 266 may be performed by or under the control of the controller/processor 280.

As indicated above, FIG. 2 is provided as an example. Other examples may differ from what is described with regard to FIG. 2.

Figure 3:
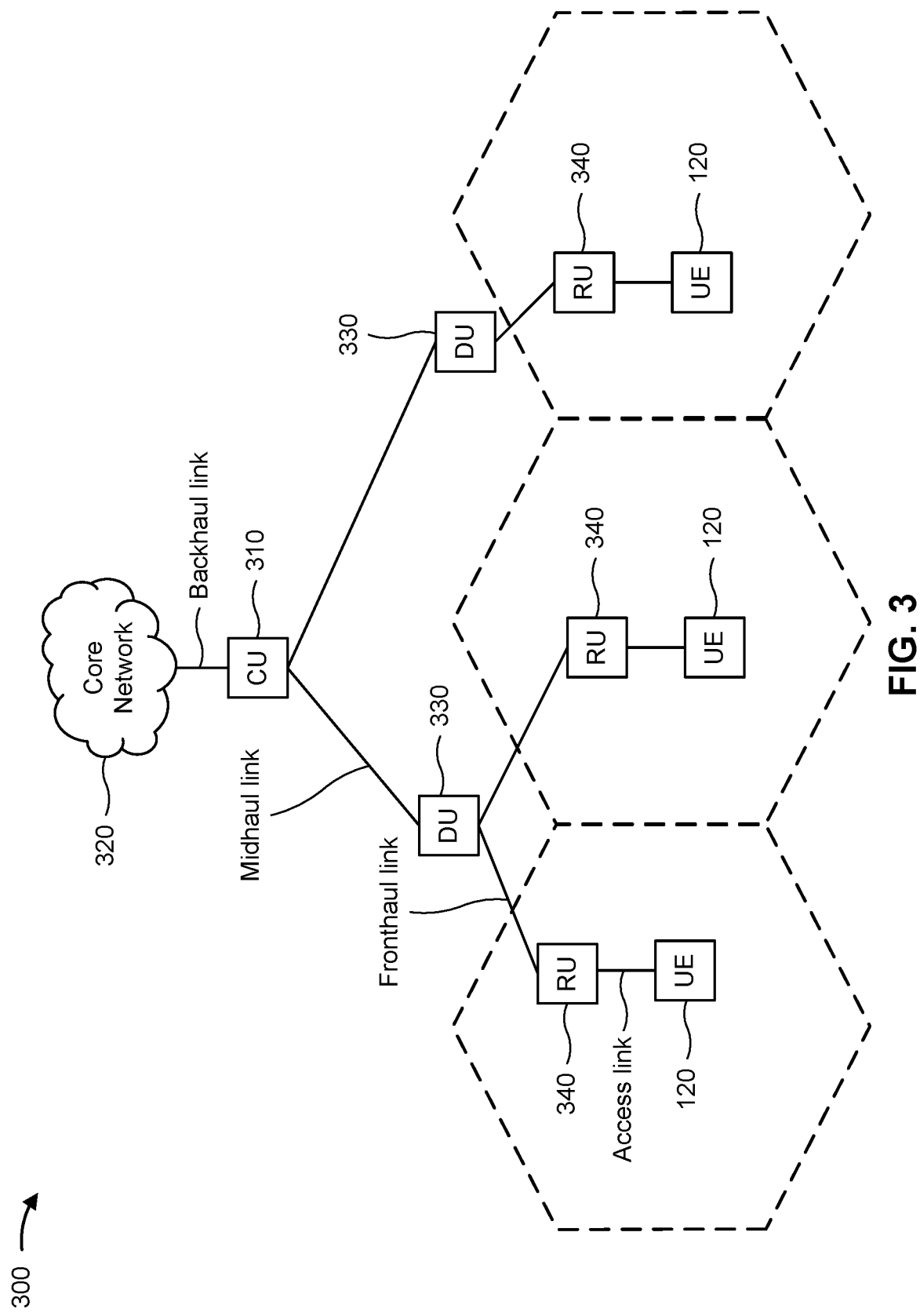
FIG. 3 is a diagram illustrating an example of an open radio access network (O-RAN) architecture, in accordance with the present disclosure.

FIG. 3 is a diagram illustrating an example 300 of an O-RAN architecture, in accordance with the present disclosure. As shown in FIG. 3, the O-RAN architecture may include a control unit (CU) 310 that communicates with a core network 320 via a backhaul link. Furthermore, the CU 310 may communicate with one or more distributed units (DUs) 330 via respective midhaul links. The DUs 330 may each communicate with one or more radio units (RUs) 340 via respective fronthaul links, and the RUs 340 may each communicate with respective UEs 120 via radio frequency (RF) access links. The DUs 330 and the RUs 340 may also be referred to as O-RAN DUs (O-DUs) 330 and O-RAN RUs (O-RUs) 340, respectively.

In some examples, the DUs 330 and the RUs 340 may be implemented according to a functional split architecture in which functionality of a base station 110 (e.g., an eNB or a gNB) is provided by a DU 330 and one or more RUs 340 that communicate over a fronthaul link. Accordingly, as described herein, a base station 110 may include a DU 330 and one or more RUs 340 that may be co-located or geographically distributed. In some examples, the DU 330 and the associated RU(s) 340 may communicate via a fronthaul link to exchange real-time control plane information via a lower layer split (LLS) control plane (LLS-C) interface, to exchange non-real-time management information via an LLS management plane (LLS-M) interface, and/or to exchange user plane information via an LLS user plane (LLS-U) interface.

Accordingly, the DU 330 may correspond to a logical unit that includes one or more base station functions to control the operation of one or more RUs 340. For example, in some examples, the DU 330 may host a radio link control (RLC) layer, a medium access control (MAC) layer, and one or more high physical (PHY) layers (e.g., forward error correction (FEC) encoding and decoding, scrambling, and/or modulation and demodulation) based at least in part on a lower layer functional split. Higher layer control functions, such as a packet data convergence protocol (PDCP), radio resource control (RRC), and/or service data adaptation protocol (SDAP), may be hosted by the CU 310. The RU(s) 340 controlled by a DU 330 may correspond to logical nodes that host RF processing functions and low-PHY layer functions (e.g., fast Fourier transform (FFT), inverse FFT (iFFT), digital beamforming, and/or physical random access channel (PRACH) extraction and filtering) based at least in part on the lower layer functional split. Accordingly, in an O-RAN architecture, the RU(s) 340 handle all over the air (OTA) communication with a UE 120, and real-time and non-real-time aspects of control and user plane communication with the RU(s) 340 are controlled by the corresponding DU 330, which enables the DU(s) 330 and the CU 310 to be implemented in a cloud-based RAN architecture.

As indicated above, FIG. 3 is provided as an example. Other examples may differ from what is described with regard to FIG. 3.

Figure 4:
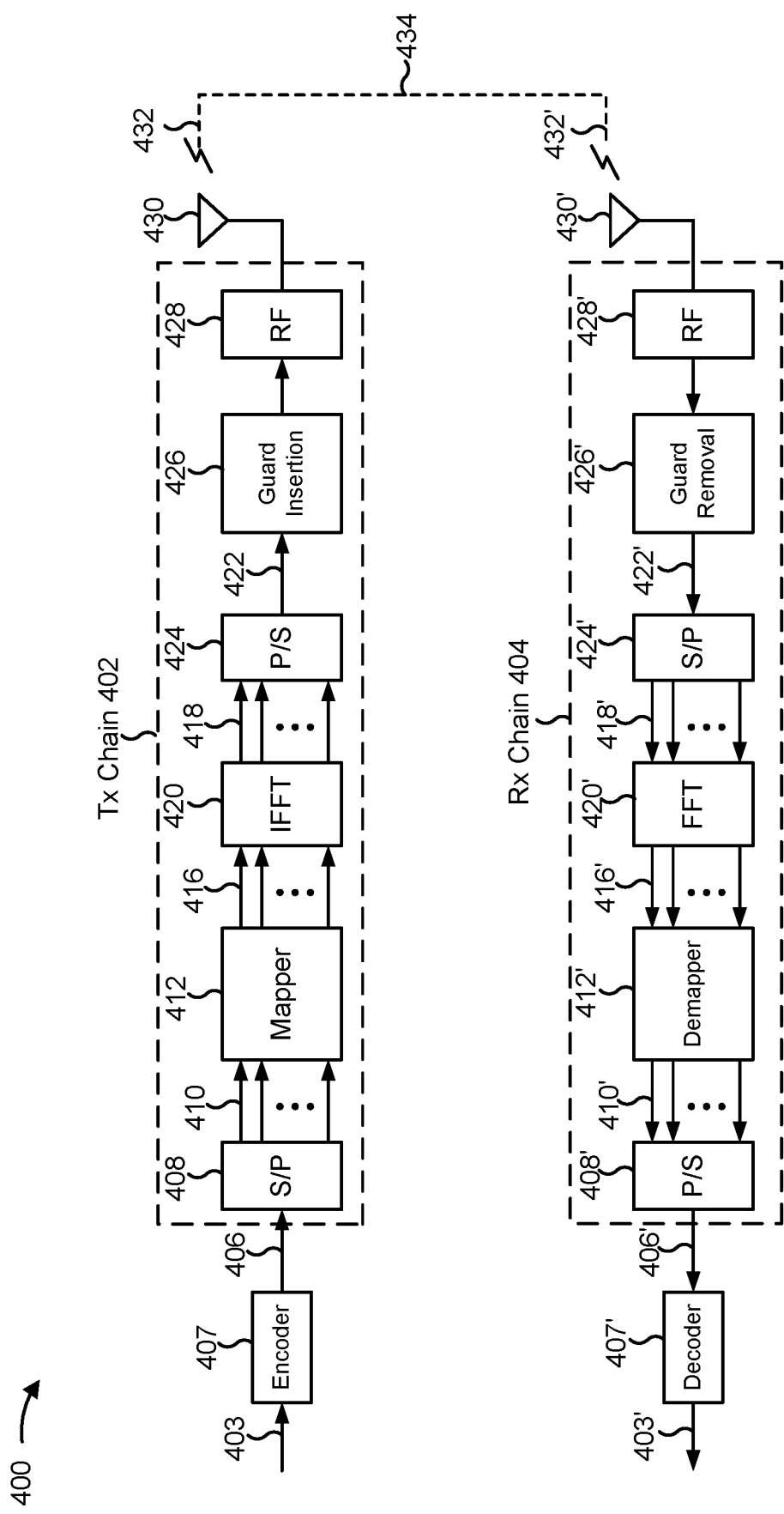
FIG. 4 is a diagram illustrating an example of a transmit (Tx) chain and a receive (Rx) chain of a network entity, in accordance with the present disclosure.

FIG. 4 is a diagram illustrating an example 400 of a transmit (Tx) chain 402 and a receive (Rx) chain 404 of a network entity (e.g., a base station 110 or a UE 120), in accordance with the present disclosure. In some examples, one or more components of Tx chain 402 may be implemented in transmit processor 264, TX MIMO processor 266, modem 254, and/or controller/processor 280, as described above in connection with FIG. 2. In some examples, Tx chain 402 may be implemented in a network entity for transmitting data 406 (e.g., uplink data, an uplink reference signal, and/or uplink control information) to base station 110 on an uplink channel.

An encoder 407 may alter a signal (e.g., a bitstream) 403 into data 406. Data 406 to be transmitted is provided from encoder 407 as input to a serial-to-parallel (S/P) converter 408. In some examples, S/P converter 408 may split the transmission data into N parallel data streams 410.

The N parallel data streams 410 may then be provided as input to a mapper 412. Mapper 412 may map the N parallel data streams 410 onto N constellation points. The mapping may be done using a modulation constellation, such as binary phase-shift keying (BPSK), quadrature phase-shift keying (QPSK), 8 phase-shift keying (8PSK), quadrature amplitude modulation (QAM), etc. Thus, mapper 412 may output N parallel symbol streams 416, each symbol stream 416 corresponding to one of N orthogonal subcarriers of an inverse fast Fourier transform (IFFT) component 420. These N parallel symbol streams 416 are represented in the frequency domain and may be converted into N parallel time domain sample streams 418 by IFFT component 420.

In some examples, N parallel modulations in the frequency domain correspond to N modulation symbols in the frequency domain, which are equal to N mapping and N-point IFFT in the frequency domain, which are equal to one (useful) OFDM symbol in the time domain, which are equal to N samples in the time domain One OFDM symbol in the time domain, Ns, is equal to Ncp (the number of guard samples per OFDM symbol)+N (the number of useful samples per OFDM symbol).

The N parallel time domain sample streams 418 may be converted into an OFDM/OFDMA symbol stream 422 by a parallel-to-serial (P/S) converter 424. A guard insertion component 426 may insert a guard interval between successive OFDM/OFDMA symbols in the OFDM/OFDMA symbol stream 422. The output of guard insertion component 426 may then be upconverted to a desired transmit frequency band by a radio frequency (RF) front end 428. An antenna 430 may then transmit the resulting signal 432.

In some examples, Rx chain 404 may utilize OFDM/OFDMA. In some examples, one or more components of Rx chain 404 may be implemented in receive processor 258, MIMO detector 256, modem 254, and/or controller/processor 280, as described above in connection with FIG. 2. In some examples, Rx chain 404 may be implemented in the network entity for receiving data 406 (e.g., downlink data, a downlink reference signal, and/or downlink control information) from base station 110 on a downlink channel.

A transmitted signal 432 is shown traveling over a wireless channel 434 from Tx chain 402 to Rx chain 404. When a signal 432' is received by an antenna 430', the received signal 432' may be downconverted to a baseband signal by an RF front end 428'. A guard removal component 426' may then remove the guard interval that was inserted between OFDM/OFDMA symbols by guard insertion component 426.

The output of guard removal component 426' may be provided to an S/P converter 424'. The output may include an OFDM/OFDMA symbol stream 422', and S/P converter 424' may divide the OFDM/OFDMA symbol stream 422' into N parallel time-domain symbol streams 418', each of which corresponds to one of the N orthogonal subcarriers. A fast Fourier transform (FFT) component 420' may convert the N parallel time-domain symbol streams 418' into the frequency domain and output N parallel frequency-domain symbol streams 416'.

A demapper 412' may perform the inverse of the symbol mapping operation that was performed by mapper 412, thereby outputting N parallel data streams 410'. A P/S converter 408' may combine the N parallel data streams 410' into a single data stream 406'. Ideally, data stream 406' corresponds to data 406 that was provided as input to Tx chain 402. Data stream 406' may be decoded into a decoded data stream 403' by decoder 407'.

The number and arrangement of components shown in FIG. 4 are provided as an example. In practice, there may be additional components, fewer components, different components, or differently arranged components than those shown in FIG. 4. Furthermore, two or more components shown in FIG. 4 may be implemented within a single component, or a single component shown in FIG. 4 may be implemented as multiple, distributed components. Additionally, or alternatively, a set of components (e.g., one or more components) shown in FIG. 4 may perform one or more functions described as being performed by another set of components shown in FIG. 4.

Sub-terahertz (Sub THz) communications (e.g., communications in a range of 100 GHz to 10 THz) can be used to increase throughput relative to mmWave communications. For example, by using Sub THz communications, an amount of supported bandwidth can be increased relative to a bandwidth of mmWave communications and throughput can be linearly related to bandwidth. To support larger bandwidths, analog to digital converters (ADCs) and corresponding digital to analog converters (DACs) may need to use a relatively high sampling rate, such as a 20 giga-sample per second (20 GSa/s or 20G) sampling rate. Using a quadrature mixer architecture, in which a baseband signal is processed using 2 DACs and 2 corresponding ADCs, a sampling rate of half the aforementioned sampling rate is achieved (e.g., a quadrature mixer may need a 10G sampling rate.

Figure 5:
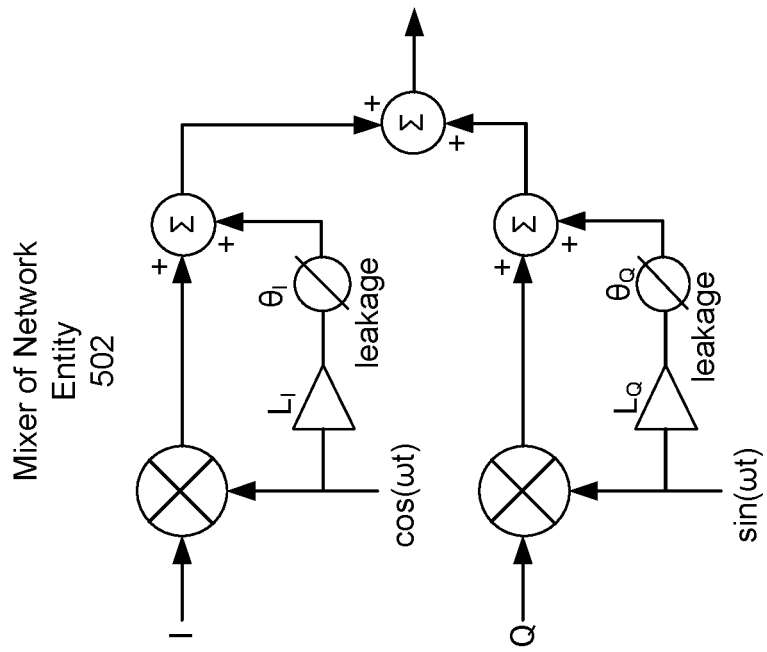
FIG. 5 is a diagram illustrating an example of local oscillator (LO) leakage, in accordance with the present disclosure.

FIG. 5 is a diagram illustrating an example 500 of local oscillator (LO) leakage, in accordance with the present disclosure. As shown in FIG. 5, example 500 shows a representation of in-phase (I) and quadrature (Q) LO leakage in a network entity 502.

As further shown in FIG. 5, in quadrature mixing, the network entity 502 may use a quadrature mixer, which may process a signal using an in-phase branch to have an in-phase component and using a quadrature branch to have a quadrature component. The in-phase branch has a mixer input of a direct current (DC) bias I and the quadrature branch has a mixer input of a DC bias Q. Leakage in each branch is represented as a scaled value $L_I$ in the in-phase branch and $L_Q$ in the quadrature branch. LO leakage $L_I$ is subject to a phase shift $\theta_I$ and LO leakage $L_Q$ is subject to a phase shift $\theta_Q$. The output of the quadrature mixer can be represented as a function of the mixer inputs and the LO leakage:

$$y(t)=I\cos(\omega t)+L_I\cos(\omega t+\theta_I)+Q\sin(\omega t)+L_Q\sin(\omega t+\theta_Q)$$

$$y(t)=A\cos(\omega t+\alpha)+B\sin(\omega t+\beta)$$

where y(t) is a representation of the overall received signal from a quadrature mixer and can be rewritten as y(t)=A cos(ωt+α)+B sin(ωt+β). Accordingly, when the phase between the sin( ) term and the cos( ) term is 90 degrees, y(t)=0 and A=B. In this case, the overall received signal can be re-expressed in terms of an equal phase condition and an equal amplitude condition:

$$IQ+IL_Q\cos\theta_Q+QL_I\cos\theta_I+L_IL_Q\cos(\theta_I-\theta_Q)=0$$

$$I^2-Q^2+2IL_I\cos\theta_I+2QL_Q\cos\theta_Q+L_I^2+L_Q^2=0$$

where the first equation represents the equal phase condition and the second equation represents the equal amplitude condition. These two equations do not have an analytical assumption (even for the condition where LO leakage phase is zero). A first numerical solution for solving the two equations involves changing I and Q DC levels and measuring leakage energy. A second numerical solution for solving the two equations uses a gradient descent method. In the case of the gradient descent method, a network entity may determine:

$$V_{diff}=(\Delta V^--\Delta V^+)/2$$

$$V_{new}=V_{old}+\mu*\text{sign}(V_{diff})/|V_{diff}|$$

where $\Delta V^-$ represents −I or Q before correction and $\Delta V^+$ represents −I or Q after correction. Although some examples are described herein in terms of the aforementioned numerical solutions, other unconstrained optimization methods, machine learning methods, neural network methods, estimation methods, or look-up table based methods, among other examples are contemplated.

As indicated above, FIG. 5 is provided as an example. Other examples may differ from what is described with respect to FIG. 5.

As described above, a quadrature mixer may use two ADCs or DACs (e.g., a first ADC or DAC for the in-phase branch and a second ADC or DAC for the quadrature branch) to halve a sampling rate relative to other types of mixers that include only a single ADC or DAC. However, a quadrature mixer may have IQ imbalance and relatively high LO leakage at a center of a bandwidth. Some techniques may attempt to cancel both the IQ imbalance and the LO leakage, but these techniques may be imperfect, resulting in some amount of LO leakage remaining LO leakage may result in an effect to a power amplifier input power, clipping or signal backoff, an effect to an effective number of bits (ENOB) at an ADC, and/or noise on adjacent LO subcarriers, among other examples. These effects may result in poor communication performance from network entities using quadrature mixers.

Some aspects described herein may provide for LO leakage reporting to enable signal processing to account for LO leakage. For example, a first network entity may estimate and report LO leakage to a second network entity, and the first network entity may report $V_{diff}$ to the second network entity to enable gradient descent correction. In this way, the first network entity may enable correction of signals mixed using a quadrature mixer. In this way, the first network entity enables use of quadrature mixers, which enables use of, for example, sub-THz bands to achieve higher levels of throughput than are achieved using, for example, mmWave bands.

Figure 6:
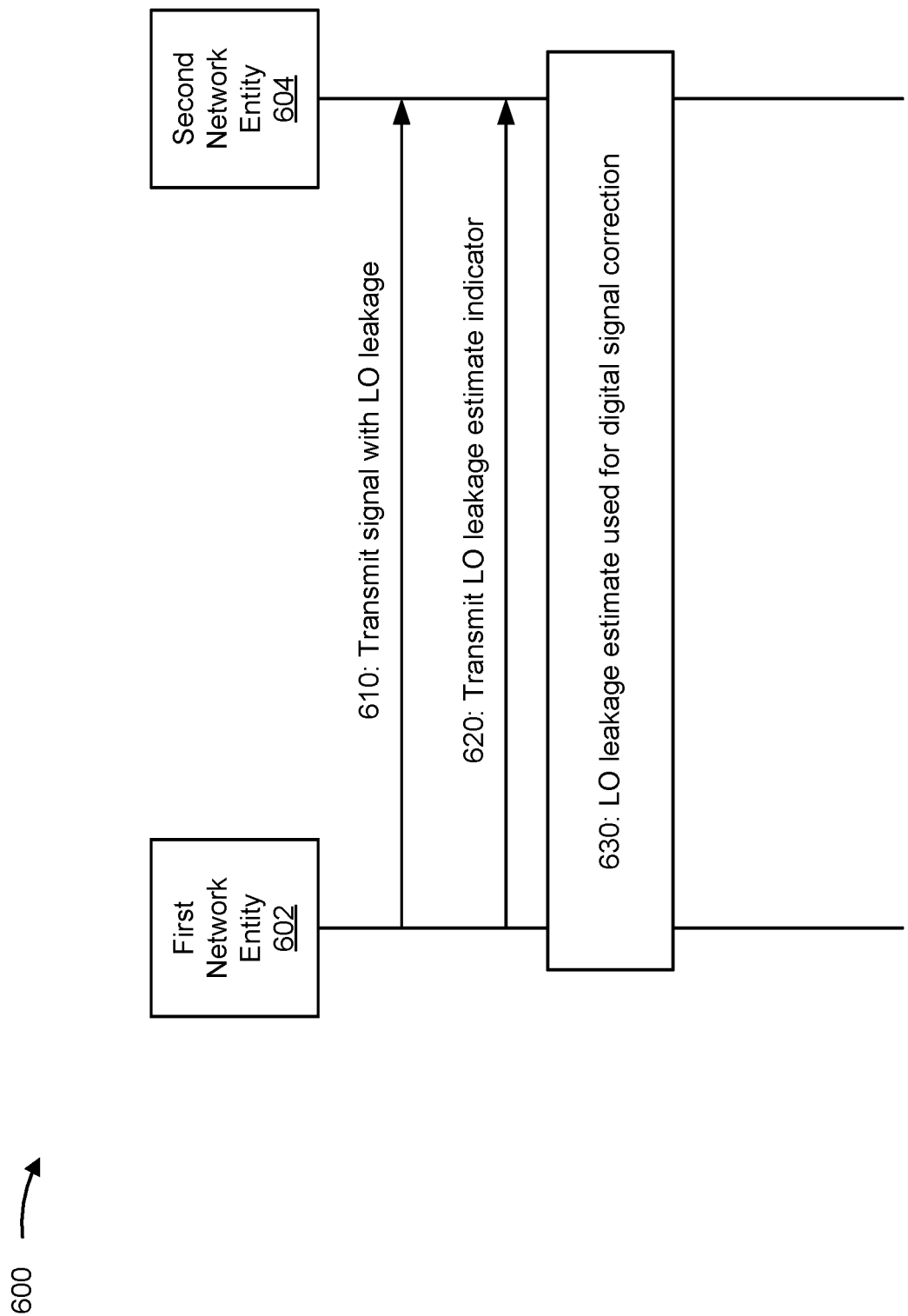
FIG. 6 is a diagram illustrating an example associated with LO leakage reporting, in accordance with the present disclosure.

FIG. 6 is a diagram illustrating an example 600 associated with LO leakage reporting, in accordance with the present disclosure. As shown in FIG. 6, example 600 includes a first network entity 602 in communication with a second network entity 604.

As further shown in FIG. 6, and by reference numbers 610 and 620, the first network entity 602 may transmit a signal to the second network entity 604 and may transmit an LO leakage estimate indicator associated with the signal. For example, the first network entity 602 may transmit a signal that is subject to LO leakage. In this case, the first network entity 602 may mix the signal using a mixer, such as a quadrature mixer, that may have LO leakage occur as part of the mixing procedure, as described above. Based at least in part on transmitting a signal subject to LO leakage, the first network entity 602 may measure LO leakage associated with the signal. This may be referred to as "self-measurement" of LO leakage. In another example, the second network entity 604 may transmit a signal subject to LO leakage and the first network entity 602 may measure LO leakage associated with the signal (transmitted by the second network entity 604). This may be referred to as "assisted-measurement" of LO leakage.

In some aspects, the first network entity 602 may transmit a capability indicator to second network entity 604 to indicate a capability for transmitting the LO leakage estimate indicator. For example, at connection establishment, the first network entity 602 may indicate a capability of self-estimating LO leakage. Additionally, or alternatively, the first network entity 602 may indicate a capability for estimating LO leakage of the second network entity 604. In this case, the first network entity 602 may indicate a capability for determining LO leakage separately from the first network entity 602 and the second network entity 604. In other words, the first network entity 602 may indicate a capability for distinguishing between LO leakage resulting from a mixer of the second network entity 604 (e.g., in transmitting a signal to the first network entity 602 or in receiving a signal from the first network entity 602) and LO leakage resulting from a mixer of the first network entity 602 (e.g., in receiving the signal from the second network entity 604 or in transmitting the signal to the second network entity 604).

In some aspects, the first network entity 602 may determine an LO leakage estimate based at least in part on receiving signaling (e.g., in a medium access control (MAC) control element (CE) or in downlink control information (DCI)) from the second network entity 604. For example, the first network entity 602 may receive signaling indicating that the second network entity 604 is predicting or expecting LO leakage on an indicated frequency, which may trigger the first network entity 602 to determine LO leakage for the indicated frequency. Additionally, or alternatively, the second network entity 604 may indicate one or more dedicated pilots or the use of one or more existing pilots (e.g., allocated for other purposes) that the first network entity 602 can use to determine LO leakage. Additionally, or alternatively, the second network entity 604 may indicate a channel on which an LO leakage estimate is to be determined, such as a demodulation reference signal (DMRS) channel, a channel state information (CSI) reference signal (RS) (CSI-RS) channel, or a physical downlink shared channel (PDSCH), among other examples. Additionally, or alternatively, the second network entity 604 may indicate whether the first network entity 602 is to estimate LO leakage post-channel-equalization or pre-channel-equalization. Additionally, or alternatively, the second network entity 604 may indicate a set of triggers for the first network entity 602 to estimate LO leakage in a differential report. In this case, the second network entity 604 may indicate one or more thresholds as the set of triggers, and when an LO leakage estimate exceeds a threshold difference from a previous LO leakage estimate, the first network entity 602 may transmit a differential report identifying the threshold difference.

In some aspects, the first network entity 602 may determine an LO leakage estimate and report the LO leakage estimate to the second network entity 604. For example, the first network entity 602 may determine LO leakage estimates for an in-phase branch and a quadrature branch of a quadrature mixer, and may transmit the LO leakage estimate indicator to identify the LO leakage estimates. In some aspects, the LO leakage estimate indicator may be an absolute value for the LO leakage estimates. Additionally, or alternatively, the LO leakage estimate indicator may be a differential value indicator of a difference in an LO leakage estimate relative to a previously indicated LO leakage estimate. In some aspects, the LO leakage estimate indicator may be reported for an uplink (e.g., a transmission from a UE 120 to a base station 110) or a downlink (e.g., a transmission from a base station 110 to a UE 120).

As further shown in FIG. 6, and by reference number 630, the second network entity 604 may use the LO leakage estimate to correct one or more subsequent signals. For example, the second network entity 604 may perform digital signal correction when processing subsequent transmissions (e.g., transmissions received from the first network entity 602 or transmissions transmitted to the first network entity 602) using the LO leakage estimate. This may reduce an effect of LO leakage on power amplifier input power, reduce noise on adjacent LO subcarriers, or reduce clipping, among other examples. In this way, the first network entity 602 enables improved throughput by providing the LO leakage estimate indicator to report an estimate of LO leakage from an oscillator, such as a quadrature oscillator of the first network entity 602 or the second network entity 604.

As indicated above, FIG. 6 is provided as an example. Other examples may differ from what is described with respect to FIG. 6.

Figure 7:
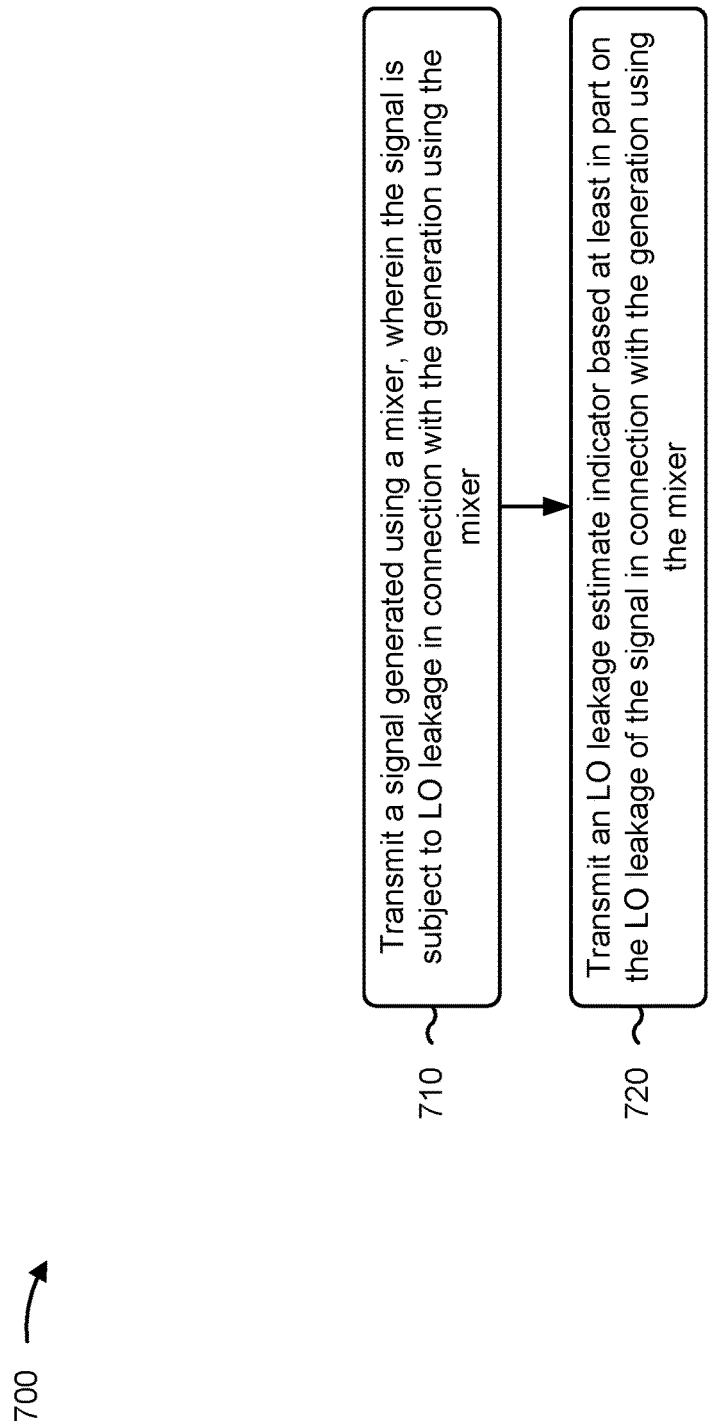
FIGS. 7-8 are diagrams illustrating example processes associated with LO leakage reporting, in accordance with the present disclosure.

FIG. 7 is a diagram illustrating an example process 700 performed, for example, by a network entity, in accordance with the present disclosure. Example process 700 is an example where the network entity (e.g., a base station 110, a UE 120, a CU 310, a DU 330, an RU 340, a network 502, or a network entity 602, among other examples) performs operations associated with LO leakage reporting.

As shown in FIG. 7, in some aspects, process 700 may include transmitting a signal generated using a mixer, wherein the signal is subject to LO leakage in connection with the generation using the mixer (block 710). For example, the network entity (e.g., using communication manager 140/150 and/or transmission component 904, depicted in FIG. 9) may transmit a signal generated using a mixer, wherein the signal is subject to LO leakage in connection with the generation using the mixer, as described above.

As further shown in FIG. 7, in some aspects, process 700 may include transmitting an LO leakage estimate indicator based at least in part on the LO leakage of the signal in connection with the generation using the mixer (block 720). For example, the network entity (e.g., using communication manager 140/150 and/or transmission component 904, depicted in FIG. 9) may transmit an LO leakage estimate indicator based at least in part on the LO leakage of the signal in connection with the generation using the mixer, as described above.

Process 700 may include additional aspects, such as any single aspect or any combination of aspects described below and/or in connection with one or more other processes described elsewhere herein.

In a first aspect, the mixer is a quadrature mixer.

In a second aspect, alone or in combination with the first aspect, process 700 includes generating the signal using the mixer, estimating the LO leakage to which the signal is subject in connection with generation using the mixer, and generating the LO leakage estimate indicator based at least in part on estimating the LO leakage to which the signal is subject.

In a third aspect, alone or in combination with one or more of the first and second aspects, process 700 includes transmitting a capability indicator of a capability for estimating the LO leakage, and transmitting the LO leakage estimate indicator comprises transmitting the LO leakage estimate indicator based at least in part on transmitting the capability indicator of the capability for estimating the LO leakage.

In a fourth aspect, alone or in combination with one or more of the first through third aspects, process 700 includes receiving an indication that LO leakage is to occur on a particular frequency, and transmitting the LO leakage estimate indicator comprises transmitting the LO leakage estimate indicator for the particular frequency based at least in part on receiving the indication that LO leakage is to occur on the particular frequency.

In a fifth aspect, alone or in combination with one or more of the first through fourth aspects, process 700 includes receiving an indication of a set of pilots, wherein the LO leakage estimate indicator is based at least in part on the set of pilots.

In a sixth aspect, alone or in combination with one or more of the first through fifth aspects, process 700 includes receiving an indication of a slot in which LO leakage is to occur for determination of an estimate of the LO leakage.

In a seventh aspect, alone or in combination with one or more of the first through sixth aspects, process 700 includes receiving an indication of a set of channels for LO leakage estimation, wherein the LO leakage estimate indicator is based at least in part on the set of channels.

In an eighth aspect, alone or in combination with one or more of the first through seventh aspects, process 700 includes receiving an indication of a configuration for estimating the LO leakage, wherein the LO leakage estimate indicator is based at least in part on the configuration.

In a ninth aspect, alone or in combination with one or more of the first through eighth aspects, the configuration includes a parameter indicating whether estimating LO leakage is to occur post-channel equalization or pre-channel equalization.

In a tenth aspect, alone or in combination with one or more of the first through ninth aspects, process 700 includes receiving an indication of a configuration for a set of triggers for estimating the LO leakage, and transmitting the LO leakage estimate indicator comprises transmitting the LO leakage estimate indicator based at least in part on satisfaction of the set of triggers.

In an eleventh aspect, alone or in combination with one or more of the first through tenth aspects, process 700 includes receiving information associated with configuring the network entity to transmit the LO leakage estimate indicator on at least one of a MAC CE or a downlink control information channel.

In a twelfth aspect, alone or in combination with one or more of the first through eleventh aspects, the LO leakage estimate indicator includes at least one of an in-phase value for the LO leakage or a quadrature value for the LO leakage.

In a thirteenth aspect, alone or in combination with one or more of the first through twelfth aspects, the LO leakage estimate indicator includes a parameter indicating a difference in an estimated value for the LO leakage from a previously reported estimated value for the LO leakage.

Although FIG. 7 shows example blocks of process 700, in some aspects, process 700 may include additional blocks, fewer blocks, different blocks, or differently arranged blocks than those depicted in FIG. 7. Additionally, or alternatively, two or more of the blocks of process 700 may be performed in parallel.

Figure 8:
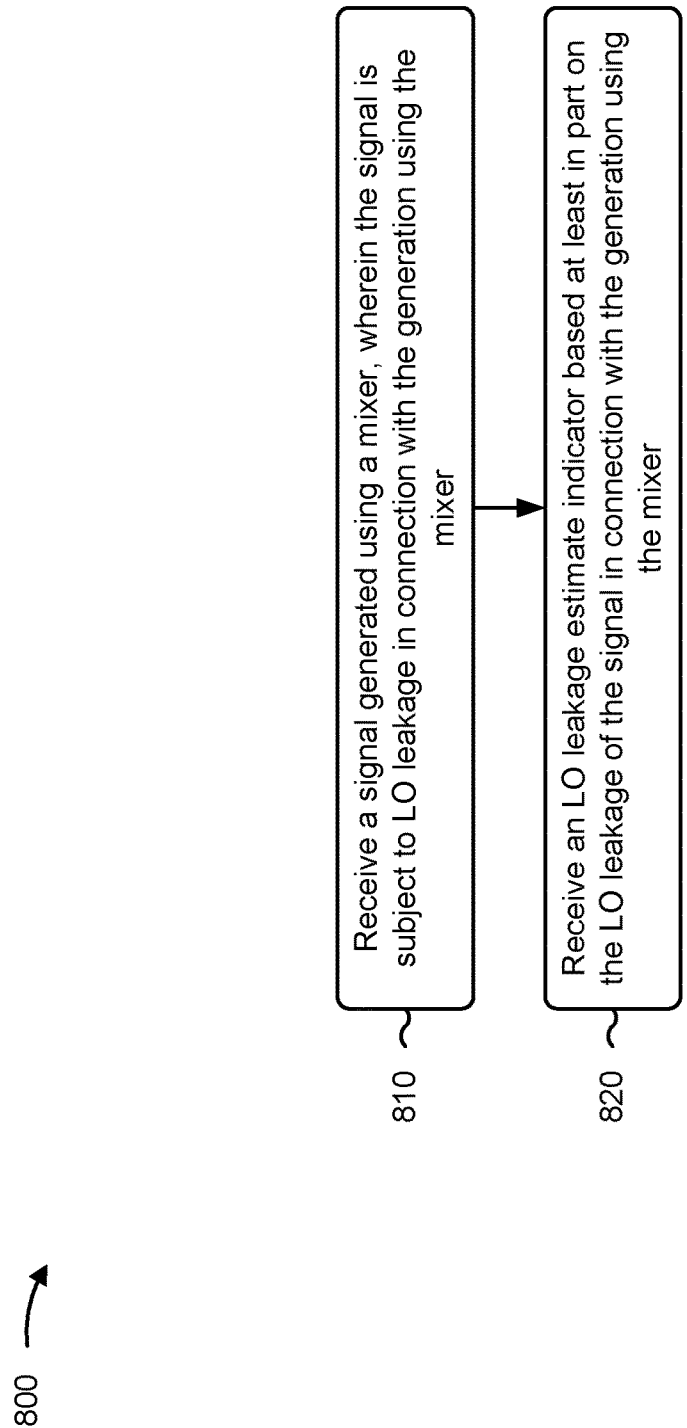

FIG. 8 is a diagram illustrating an example process 800 performed, for example, by a network entity, in accordance with the present disclosure. Example process 800 is an example where the network entity (e.g., a base station 110, a UE 120, a CU 310, a DU 330, an RU 340, a network 502, or a network entity 604, among other examples) performs operations associated with LO leakage reporting.

As shown in FIG. 8, in some aspects, process 800 may include receiving a signal generated using a mixer, wherein the signal is subject to LO leakage in connection with the generation using the mixer (block 810). For example, the network entity (e.g., using communication manager 140/150 and/or reception component 902, depicted in FIG. 9) may receive a signal generated using a mixer, wherein the signal is subject to LO leakage in connection with the generation using the mixer, as described above.

As further shown in FIG. 8, in some aspects, process 800 may include receiving an LO leakage estimate indicator based at least in part on the LO leakage of the signal in connection with the generation using the mixer (block 820). For example, the network entity (e.g., using communication manager 140/150 and/or reception component 902, depicted in FIG. 9) may receive an LO leakage estimate indicator based at least in part on the LO leakage of the signal in connection with the generation using the mixer, as described above.

Process 800 may include additional aspects, such as any single aspect or any combination of aspects described below and/or in connection with one or more other processes described elsewhere herein.

In a first aspect, process 800 includes correcting one or more signals based on the LO leakage estimate indicator.

In a second aspect, alone or in combination with the first aspect, the mixer is a quadrature mixer.

In a third aspect, alone or in combination with one or more of the first and second aspects, process 800 includes receiving a capability indicator of a capability for estimating the LO leakage, and receiving the LO leakage estimate indicator comprises receiving the LO leakage estimate indicator based at least in part on receiving the capability indicator of the capability for estimating the LO leakage.

In a fourth aspect, alone or in combination with one or more of the first through third aspects, process 800 includes transmitting an indication that LO leakage is to occur on a particular frequency, and receiving the LO leakage estimate indicator comprises receiving the LO leakage estimate indicator for the particular frequency based at least in part on transmitting the indication that LO leakage is to occur on the particular frequency.

In a fifth aspect, alone or in combination with one or more of the first through fourth aspects, process 800 includes transmitting an indication of a set of pilots, wherein the LO leakage estimate indicator is based at least in part on the set of pilots.

In a sixth aspect, alone or in combination with one or more of the first through fifth aspects, process 800 includes transmitting an indication of a slot in which LO leakage is to occur for determination of an estimate of the LO leakage.

In a seventh aspect, alone or in combination with one or more of the first through sixth aspects, process 800 includes transmitting an indication of a set of channels for LO leakage estimation, wherein the LO leakage estimate indicator is based at least in part on the set of channels.

In an eighth aspect, alone or in combination with one or more of the first through seventh aspects, process 800 includes transmitting an indication of a configuration for estimating the LO leakage, wherein the LO leakage estimate indicator is based at least in part on the configuration.

In a ninth aspect, alone or in combination with one or more of the first through eighth aspects, the configuration includes a parameter indicating whether estimating LO leakage is to occur post-channel equalization or pre-channel equalization.

In a tenth aspect, alone or in combination with one or more of the first through ninth aspects, process 800 includes transmitting an indication of a configuration for a set of triggers for estimating the LO leakage, and receiving the LO leakage estimate indicator comprises receiving the LO leakage estimate indicator based at least in part on satisfaction of the set of triggers.

In an eleventh aspect, alone or in combination with one or more of the first through tenth aspects, process 800 includes transmitting information associated with configuring the network entity to receive the LO leakage estimate indicator on at least one of a MAC CE or a downlink control information channel.

In a twelfth aspect, alone or in combination with one or more of the first through eleventh aspects, the LO leakage estimate indicator includes at least one of an in-phase value for the LO leakage or a quadrature value for the LO leakage.

In a thirteenth aspect, alone or in combination with one or more of the first through twelfth aspects, the LO leakage estimate indicator includes a parameter indicating a difference in an estimated value for the LO leakage from a previously reported estimated value for the LO leakage.

Although FIG. 8 shows example blocks of process 800, in some aspects, process 800 may include additional blocks, fewer blocks, different blocks, or differently arranged blocks than those depicted in FIG. 8. Additionally, or alternatively, two or more of the blocks of process 800 may be performed in parallel.

Figure 9:
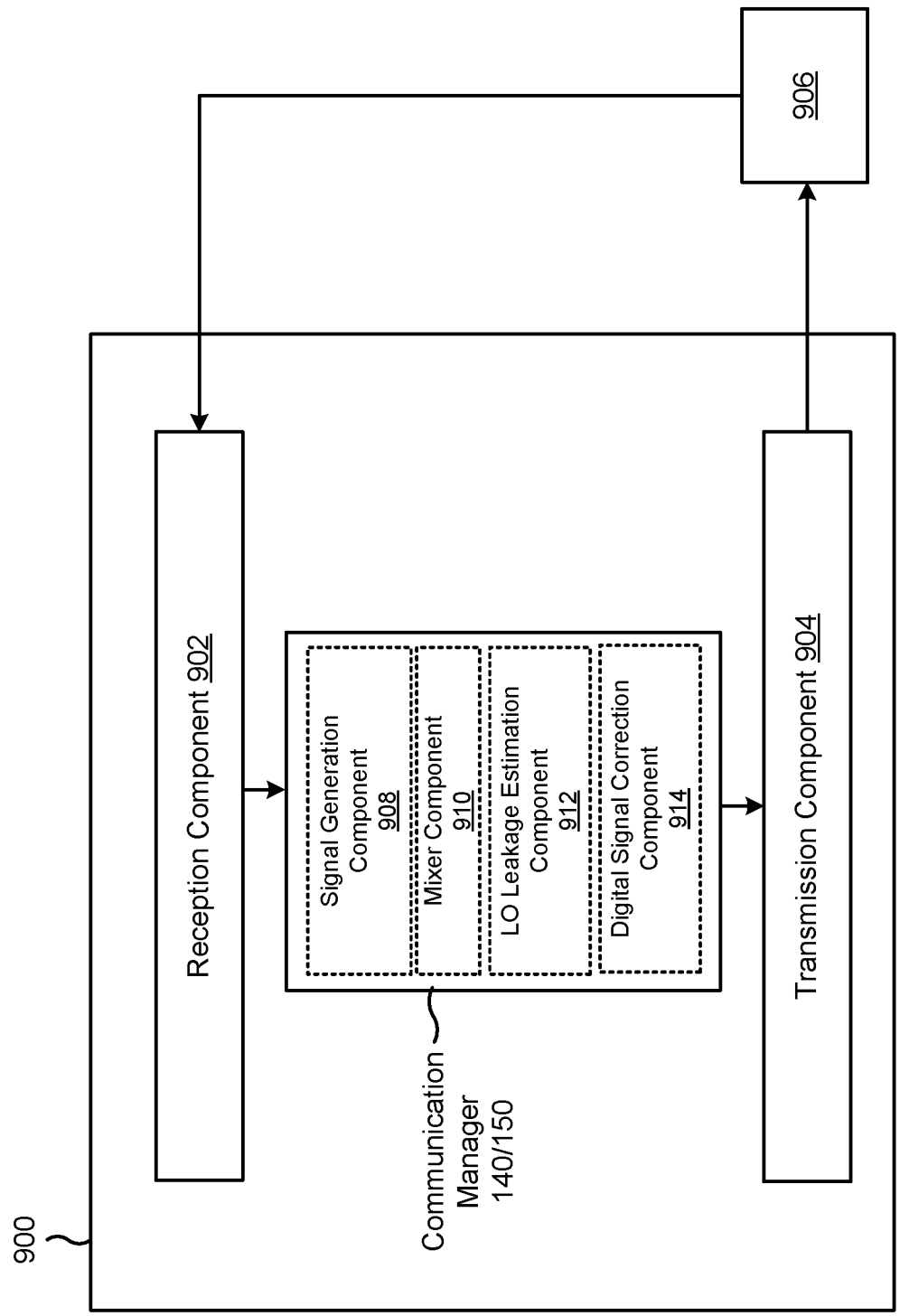
FIG. 9 is a diagram of an example apparatus for wireless communication, in accordance with the present disclosure.

FIG. 9 is a diagram of an example apparatus 900 for wireless communication. The apparatus 900 may be a network entity, or a network entity may include the apparatus 900. In some aspects, the apparatus 900 includes a reception component 902 and a transmission component 904, which may be in communication with one another (for example, via one or more buses and/or one or more other components). As shown, the apparatus 900 may communicate with another apparatus 906 (such as a UE, a base station, or another wireless communication device) using the reception component 902 and the transmission component 904. As further shown, the apparatus 900 may include the communication manager 140/150. The communication manager 140/150 may include one or more of a signal generation component 908, a mixer component 910, an LO leakage estimation component 912, or a digital signal correction component 914, among other examples.

In some aspects, the apparatus 900 may be configured to perform one or more operations described herein in connection with FIG. 6. Additionally, or alternatively, the apparatus 900 may be configured to perform one or more processes described herein, such as process 700 of FIG. 7, process 800 of FIG. 8, or a combination thereof. In some aspects, the apparatus 900 and/or one or more components shown in FIG. 9 may include one or more components of the network entity described in connection with FIG. 2. Additionally, or alternatively, one or more components shown in FIG. 9 may be implemented within one or more components described in connection with FIG. 2. Additionally, or alternatively, one or more components of the set of components may be implemented at least in part as software stored in a memory. For example, a component (or a portion of a component) may be implemented as instructions or code stored in a non-transitory computer-readable medium and executable by a controller or a processor to perform the functions or operations of the component.

The reception component 902 may receive communications, such as reference signals, control information, data communications, or a combination thereof, from the apparatus 906. The reception component 902 may provide received communications to one or more other components of the apparatus 900. In some aspects, the reception component 902 may perform signal processing on the received communications (such as filtering, amplification, demodulation, analog-to-digital conversion, demultiplexing, deinterleaving, de-mapping, equalization, interference cancellation, or decoding, among other examples), and may provide the processed signals to the one or more other components of the apparatus 900. In some aspects, the reception component 902 may include one or more antennas, a modem, a demodulator, a MIMO detector, a receive processor, a controller/processor, a memory, or a combination thereof, of the network entity described in connection with FIG. 2.

The transmission component 904 may transmit communications, such as reference signals, control information, data communications, or a combination thereof, to the apparatus 906. In some aspects, one or more other components of the apparatus 900 may generate communications and may provide the generated communications to the transmission component 904 for transmission to the apparatus 906. In some aspects, the transmission component 904 may perform signal processing on the generated communications (such as filtering, amplification, modulation, digital-to-analog conversion, multiplexing, interleaving, mapping, or encoding, among other examples), and may transmit the processed signals to the apparatus 906. In some aspects, the transmission component 904 may include one or more antennas, a modem, a modulator, a transmit MIMO processor, a transmit processor, a controller/processor, a memory, or a combination thereof, of the network entity described in connection with FIG. 2. In some aspects, the transmission component 904 may be co-located with the reception component 902 in a transceiver.

The transmission component 904 may transmit a signal generated using a mixer, wherein the signal is subject to LO leakage in connection with the generation using the mixer. The transmission component 904 may transmit an LO leakage estimate indicator based at least in part on the LO leakage of the signal in connection with the generation using the mixer. The signal generation component 908 may generate the signal using the mixer component 910.

The LO leakage estimation component 912 may estimate the LO leakage to which the signal is subject in connection with generation using the mixer. The LO leakage estimation component 912 may generate the LO leakage estimate indicator based at least in part on estimating the LO leakage to which the signal is subject. The transmission component 904 may transmit a capability indicator of a capability for estimating the LO leakage. The reception component 902 may receive an indication that LO leakage is to occur on a particular frequency. The reception component 902 may receive an indication of a set of pilots, wherein the LO leakage estimate indicator is based at least in part on the set of pilots.

The reception component 902 may receive an indication of a slot in which LO leakage is to occur for determination of an estimate of the LO leakage. The reception component 902 may receive an indication of a set of channels for LO leakage estimation, wherein the LO leakage estimate indicator is based at least in part on the set of channels. The reception component 902 may receive an indication of a configuration for estimating the LO leakage, wherein the LO leakage estimate indicator is based at least in part on the configuration. The reception component 902 may receive an indication of a configuration for a set of triggers for estimating the LO leakage. The reception component 902 may receive information associated with configuring the network entity to transmit the LO leakage estimate indicator on at least one of a MAC CE or a downlink control information channel.

The reception component 902 may receive a signal generated using a mixer, wherein the signal is subject to LO leakage in connection with the generation using the mixer. The reception component 902 may receive an LO leakage estimate indicator based at least in part on the LO leakage of the signal in connection with the generation using the mixer.

The digital signal correction component 914 may correct one or more signals based on the LO leakage estimate indicator. The reception component 902 may receive a capability indicator of a capability for estimating the LO leakage. The transmission component 904 may transmit an indication that LO leakage is to occur on a particular frequency. The transmission component 904 may transmit an indication of a set of pilots, wherein the LO leakage estimate indicator is based at least in part on the set of pilots. The transmission component 904 may transmit an indication of a slot in which LO leakage is to occur for determination of an estimate of the LO leakage. The transmission component 904 may transmit an indication of a set of channels for LO leakage estimation, wherein the LO leakage estimate indicator is based at least in part on the set of channels. The transmission component 904 may transmit an indication of a configuration for estimating the LO leakage, wherein the LO leakage estimate indicator is based at least in part on the configuration. The transmission component 904 may transmit an indication of a configuration for a set of triggers for estimating the LO leakage. The transmission component 904 may transmit information associated with configuring the network entity to receive the LO leakage estimate indicator on at least one of a MAC CE or a downlink control information channel.

The number and arrangement of components shown in FIG. 9 are provided as an example. In practice, there may be additional components, fewer components, different components, or differently arranged components than those shown in FIG. 9. Furthermore, two or more components shown in FIG. 9 may be implemented within a single component, or a single component shown in FIG. 9 may be implemented as multiple, distributed components. Additionally, or alternatively, a set of (one or more) components shown in FIG. 9 may perform one or more functions described as being performed by another set of components shown in FIG. 9.

The following provides an overview of some Aspects of the present disclosure:

Aspect 1: A method of wireless communication performed by a network entity, comprising: transmitting a signal generated using a mixer, wherein the signal is subject to local oscillator (LO) leakage in connection with the generation using the mixer; and transmitting an LO leakage estimate indicator based at least in part on the LO leakage of the signal in connection with the generation using the mixer.

Aspect 2: The method of Aspect 1, wherein the mixer is a quadrature mixer.

Aspect 3: The method of any of Aspects 1 to 2, further comprising: generating the signal using the mixer; estimating the LO leakage to which the signal is subject in connection with generation using the mixer; and generating the LO leakage estimate indicator based at least in part on estimating the LO leakage to which the signal is subject.

Aspect 4: The method of any of Aspects 1 to 3, further comprising: transmitting a capability indicator of a capability for estimating the LO leakage; and wherein transmitting the LO leakage estimate indicator comprises: transmitting the LO leakage estimate indicator based at least in part on transmitting the capability indicator of the capability for estimating the LO leakage.

Aspect 5: The method of any of Aspects 1 to 4, further comprising: receiving an indication that LO leakage is to occur on a particular frequency; and wherein transmitting the LO leakage estimate indicator comprises: transmitting the LO leakage estimate indicator for the particular frequency based at least in part on receiving the indication that LO leakage is to occur on the particular frequency.

Aspect 6: The method of any of Aspects 1 to 5, further comprising: receiving an indication of a set of pilots, wherein the LO leakage estimate indicator is based at least in part on the set of pilots.

Aspect 7: The method of any of Aspects 1 to 6, further comprising: receiving an indication of a slot in which LO leakage is to occur for determination of an estimate of the LO leakage.

Aspect 8: The method of any of Aspects 1 to 7, further comprising: receiving an indication of a set of channels for LO leakage estimation, wherein the LO leakage estimate indicator is based at least in part on the set of channels.

Aspect 9: The method of any of Aspects 1 to 8, further comprising: receiving an indication of a configuration for estimating the LO leakage, wherein the LO leakage estimate indicator is based at least in part on the configuration.

Aspect 10: The method of Aspect 9, wherein the configuration includes a parameter indicating whether estimating LO leakage is to occur post-channel equalization or pre-channel equalization.

Aspect 11: The method of any of Aspects 1 to 10, further comprising: receiving an indication of a configuration for a set of triggers for estimating the LO leakage, and wherein transmitting the LO leakage estimate indicator comprises: transmitting the LO leakage estimate indicator based at least in part on satisfaction of the set of triggers.

Aspect 12: The method of any of Aspects 1 to 11, further comprising: receiving information associated with configuring the network entity to transmit the LO leakage estimate indicator on at least one of a medium access control (MAC) control element (CE) or a downlink control information channel.

Aspect 13: The method of any of Aspects 1 to 12, wherein the LO leakage estimate indicator includes at least one of an in-phase value for the LO leakage or a quadrature value for the LO leakage.

Aspect 14: The method of any of Aspects 1 to 13, wherein the LO leakage estimate indicator includes a parameter indicating a difference in an estimated value for the LO leakage from a previously reported estimated value for the LO leakage.

Aspect 15: A method of wireless communication performed by a network entity, comprising: receiving a signal generated using a mixer, wherein the signal is subject to local oscillator (LO) leakage in connection with the generation using the mixer; and receiving an LO leakage estimate indicator based at least in part on the LO leakage of the signal in connection with the generation using the mixer.

Aspect 16: The method of Aspect 15, further comprising: correcting one or more signals based on the LO leakage estimate indicator.

Aspect 17: The method of any of Aspects 15 to 16, wherein the mixer is a quadrature mixer.

Aspect 18: The method of any of Aspects 15 to 17, further comprising: receiving a capability indicator of a capability for estimating the LO leakage; and wherein receiving the LO leakage estimate indicator comprises: receiving the LO leakage estimate indicator based at least in part on receiving the capability indicator of the capability for estimating the LO leakage.

Aspect 19: The method of any of Aspects 15 to 18, further comprising: transmitting an indication that LO leakage is to occur on a particular frequency; and wherein receiving the LO leakage estimate indicator comprises: receiving the LO leakage estimate indicator for the particular frequency based at least in part on transmitting the indication that LO leakage is to occur on the particular frequency.

Aspect 20: The method of any of Aspects 15 to 19, further comprising: transmitting an indication of a set of pilots, wherein the LO leakage estimate indicator is based at least in part on the set of pilots.

Aspect 21: The method of any of Aspects 15 to 20, further comprising: transmitting an indication of a slot in which LO leakage is to occur for determination of an estimate of the LO leakage.

Aspect 22: The method of any of Aspects 15 to 21, further comprising: transmitting an indication of a set of channels for LO leakage estimation, wherein the LO leakage estimate indicator is based at least in part on the set of channels.

Aspect 23: The method of any of Aspects 15 to 22, further comprising: transmitting an indication of a configuration for estimating the LO leakage, wherein the LO leakage estimate indicator is based at least in part on the configuration.

Aspect 24: The method of Aspect 23, wherein the configuration includes a parameter indicating whether estimating LO leakage is to occur post-channel equalization or pre-channel equalization.

Aspect 25: The method of any of Aspects 15 to 24, further comprising: transmitting an indication of a configuration for a set of triggers for estimating the LO leakage, and wherein receiving the LO leakage estimate indicator comprises: receiving the LO leakage estimate indicator based at least in part on satisfaction of the set of triggers.

Aspect 26: The method of any of Aspects 15 to 25, further comprising: transmitting information associated with configuring the network entity to receive the LO leakage estimate indicator on at least one of a medium access control (MAC) control element (CE) or a downlink control information channel.

Aspect 27: The method of any of Aspects 15 to 26, wherein the LO leakage estimate indicator includes at least one of an in-phase value for the LO leakage or a quadrature value for the LO leakage.

Aspect 28: The method of any of Aspects 15 to 27, wherein the LO leakage estimate indicator includes a parameter indicating a difference in an estimated value for the LO leakage from a previously reported estimated value for the LO leakage.

Aspect 29: An apparatus for wireless communication at a device, comprising a processor; memory coupled with the processor; and instructions stored in the memory and executable by the processor to cause the apparatus to perform the method of one or more of Aspects 1-14.

Aspect 30: A device for wireless communication, comprising a memory and one or more processors coupled to the memory, the one or more processors configured to perform the method of one or more of Aspects 1-14.

Aspect 31: An apparatus for wireless communication, comprising at least one means for performing the method of one or more of Aspects 1-14.

Aspect 32: A non-transitory computer-readable medium storing code for wireless communication, the code comprising instructions executable by a processor to perform the method of one or more of Aspects 1-14.

Aspect 33: A non-transitory computer-readable medium storing a set of instructions for wireless communication, the set of instructions comprising one or more instructions that, when executed by one or more processors of a device, cause the device to perform the method of one or more of Aspects 1-14.

Aspect 34: An apparatus for wireless communication at a device, comprising a processor; memory coupled with the processor; and instructions stored in the memory and executable by the processor to cause the apparatus to perform the method of one or more of Aspects 15-28.

Aspect 35: A device for wireless communication, comprising a memory and one or more processors coupled to the memory, the one or more processors configured to perform the method of one or more of Aspects 15-28.

Aspect 36: An apparatus for wireless communication, comprising at least one means for performing the method of one or more of Aspects 15-28.

Aspect 37: A non-transitory computer-readable medium storing code for wireless communication, the code comprising instructions executable by a processor to perform the method of one or more of Aspects 15-28.

Aspect 38: A non-transitory computer-readable medium storing a set of instructions for wireless communication, the set of instructions comprising one or more instructions that, when executed by one or more processors of a device, cause the device to perform the method of one or more of Aspects 15-28.

The foregoing disclosure provides illustration and description but is not intended to be exhaustive or to limit the aspects to the precise forms disclosed. Modifications and variations may be made in light of the above disclosure or may be acquired from practice of the aspects.

As used herein, the term "component" is intended to be broadly construed as hardware and/or a combination of hardware and software. "Software" shall be construed broadly to mean instructions, instruction sets, code, code segments, program code, programs, subprograms, software modules, applications, software applications, software packages, routines, subroutines, objects, executables, threads of execution, procedures, and/or functions, among other examples, whether referred to as software, firmware, middleware, microcode, hardware description language, or otherwise. As used herein, a "processor" is implemented in hardware and/or a combination of hardware and software. It will be apparent that systems and/or methods described herein may be implemented in different forms of hardware and/or a combination of hardware and software. The actual specialized control hardware or software code used to implement these systems and/or methods is not limiting of the aspects. Thus, the operation and behavior of the systems and/or methods are described herein without reference to specific software code, since those skilled in the art will understand that software and hardware can be designed to implement the systems and/or methods based, at least in part, on the description herein.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various aspects. Many of these features may be combined in ways not specifically recited in the claims and/or disclosed in the specification. The disclosure of various aspects includes each dependent claim in combination with every other claim in the claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Furthermore, as used herein, the terms "set" and "group" are intended to include one or more items and may be used interchangeably with "one or more." Where only one item is intended, the phrase "only one" or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A network entity for wireless communication, comprising:
one or more memories; and
one or more processors, coupled to the one or more memories, configured to:
transmit a signal generated using a mixer, wherein the signal is subject to local oscillator (LO) leakage in connection with the generation using the mixer; and
transmit an LO leakage estimate indicator based at least in part on the LO leakage of the signal in connection with the generation using the mixer.

2. The network entity of claim 1, wherein the mixer is a quadrature mixer.

3. The network entity of claim 1, wherein the one or more processors are further configured to:
generate the signal using the mixer;
estimate the LO leakage to which the signal is subject in connection with generation using the mixer; and
generate the LO leakage estimate indicator based at least in part on estimating the LO leakage to which the signal is subject.

4. The network entity of claim 1, wherein the one or more processors are further configured to:
transmit a capability indicator of a capability for estimating the LO leakage; and
wherein the one or more processors, to transmit the LO leakage estimate indicator, are configured to:
transmit the LO leakage estimate indicator based at least in part on transmitting the capability indicator of the capability for estimating the LO leakage.

5. The network entity of claim 1, wherein the one or more processors are further configured to:
receive an indication that LO leakage is to occur on a particular frequency; and
wherein the one or more processors, to transmit the LO leakage estimate indicator, are configured to:
transmit the LO leakage estimate indicator for the particular frequency based at least in part on receiving the indication that LO leakage is to occur on the particular frequency.

6. The network entity of claim 1, wherein the one or more processors are further configured to:
receive an indication of a set of pilots, wherein the LO leakage estimate indicator is based at least in part on the set of pilots.

7. The network entity of claim 1, wherein the one or more processors are further configured to:
receive an indication of a slot in which LO leakage is to occur for determination of an estimate of the LO leakage.

8. The network entity of claim 1, wherein the one or more processors are further configured to:
receive an indication of a set of channels for LO leakage estimation, wherein the LO leakage estimate indicator is based at least in part on the set of channels.

9. The network entity of claim 1, wherein the one or more processors are further configured to:
receive an indication of a configuration for estimating the LO leakage, wherein the LO leakage estimate indicator is based at least in part on the configuration.

10. The network entity of claim 9, wherein the configuration includes a parameter indicating whether estimating LO leakage is to occur post-channel equalization or pre-channel equalization.

11. The network entity of claim 1, wherein the one or more processors are further configured to:
receive an indication of a configuration for a set of triggers for estimating the LO leakage, and
wherein the one or more processors, to transmit the LO leakage estimate indicator, are configured to:
transmit the LO leakage estimate indicator based at least in part on satisfaction of the set of triggers.

12. The network entity of claim 1, wherein the one or more processors are further configured to:
receive information associated with configuring the network entity to transmit the LO leakage estimate indicator on at least one of a medium access control (MAC) control element (CE) or a downlink control information channel.

13. The network entity of claim 1, wherein the LO leakage estimate indicator includes at least one of an in-phase value for the LO leakage or a quadrature value for the LO leakage.

14. The network entity of claim 1, wherein the LO leakage estimate indicator includes a parameter indicating a difference in an estimated value for the LO leakage from a previously reported estimated value for the LO leakage.

15. A method of wireless communication performed by a network entity, comprising:
transmitting a signal generated using a mixer, wherein the signal is subject to local oscillator (LO) leakage in connection with the generation using the mixer; and
transmitting an LO leakage estimate indicator based at least in part on the LO leakage of the signal in connection with the generation using the mixer.

* * * * *